United States Patent [19]
Cresswell et al.

[11] Patent Number: 5,920,067
[45] Date of Patent: *Jul. 6, 1999

[54] MONOCRYSTALLINE TEST AND REFERENCE STRUCTURES, AND USE FOR CALIBRATING INSTRUMENTS

[75] Inventors: Michael W. Cresswell, Frederick; R. N. Ghoshtagore, Elliot City; Loren W. Linholm, Ijamsville; Richard A. Allen, Germantown, all of Md.; Jeffry J. Sniegowski, Albuquerque, N.M.; William B. Penzes, Sunderland; Michael Gaitan, North Potomac, both of Md.

[73] Assignee: The United States of America as represented by the Secretary of Commerce, Washington, D.C.

[*] Notice: This patent is subject to a terminal disclaimer.

[21] Appl. No.: 08/859,914

[22] Filed: May 21, 1997

Related U.S. Application Data

[63] Continuation-in-part of application No. 08/409,467, Mar. 23, 1995, Pat. No. 5,684,301, which is a continuation-in-part of application No. 08/382,973, Feb. 3, 1995, Pat. No. 5,617,340, which is a continuation-in-part of application No. 08/236,202, Apr. 28, 1994, Pat. No. 5,602,492, which is a continuation-in-part of application No. 07/852,439, Mar. 13, 1992, Pat. No. 5,383,136.

[51] Int. Cl.$^6$ .................................................. G01R 31/26
[52] U.S. Cl. ............................................. 250/306; 257/48
[58] Field of Search ........................... 257/48; 250/491.1, 250/306; 324/158.1

[56] References Cited

U.S. PATENT DOCUMENTS

| | | | |
|---|---|---|---|
| 4,808,260 | 2/1989 | Sickafus et al. | 156/644 |
| 4,885,472 | 12/1989 | Young | 250/491.1 |
| 5,021,364 | 6/1991 | Akamine et al. | 437/228 |
| 5,043,586 | 8/1991 | Giuffre et al. | 250/491.1 |
| 5,201,992 | 4/1993 | Marcus et al. | 156/643 |
| 5,235,187 | 8/1993 | Arney et al. | 250/306 |
| 5,264,696 | 11/1993 | Toda | 250/306 |
| 5,302,239 | 4/1994 | Roe et al. | 156/643 |
| 5,365,072 | 11/1994 | Turner et al. | 250/491.1 |
| 5,449,903 | 9/1995 | Arney et al. | 250/306 |
| 5,461,907 | 10/1995 | Tench et al. | 73/105 |
| 5,475,318 | 12/1995 | Rostoker et al | 430/296 |
| 5,485,080 | 1/1996 | Larrabee et al. | 324/158.1 |
| 5,684,301 | 11/1997 | Cresswell et al. | 250/306 |

OTHER PUBLICATIONS

Nagase et al, "Metrology of Atomic . . . " *Jpn.J.Appl. Phys.*, vol. 34 Jun. 1995, pp. 3382–3387, Part 1, No. 6b.

Leone et al, "Fabricating Shaped Grid . . . ", *IBM Technical Disclosure Bull.* vol. 14, No. 2, Jul. 1971.

Cresswell et al, "Electrical Test Structures replicated . . . ", *SPIE Proceedings Series*, vol. 2725 Mar. 1996.

Allen et al, "A New Test Structure . . . ", *IEEE Electron Device Letters*, vol. 13, No. 6, Jun. 1992.

*Primary Examiner*—Jack I. Berman
*Attorney, Agent, or Firm*—Michael M. De Angeli P.C.

[57] ABSTRACT

An improved test structure for measurement of width of conductive lines formed on substrates as performed in semiconductor fabrication, and an improved reference grid for calibrating instruments for such measurements, is formed from a monocrystalline starting material, having an insulative layer formed beneath its surface by ion implantation or the equivalent, leaving a monocrystalline layer on the surface. The monocrystalline surface layer is then processed by preferential etching to accurately define components of the test structure. The substrate can be removed from the rear side of the insulative layer to form a transparent window, such that the test structure can be inspected by transmissive-optical techniques. Measurements made using electrical and optical techniques can be correlated with other measurements, including measurements made using scanning probe microscopy. Nested quadrilateral calibration reference grids particularly useful in calibrating optical coordinate measurement instruments are disclosed.

26 Claims, 5 Drawing Sheets

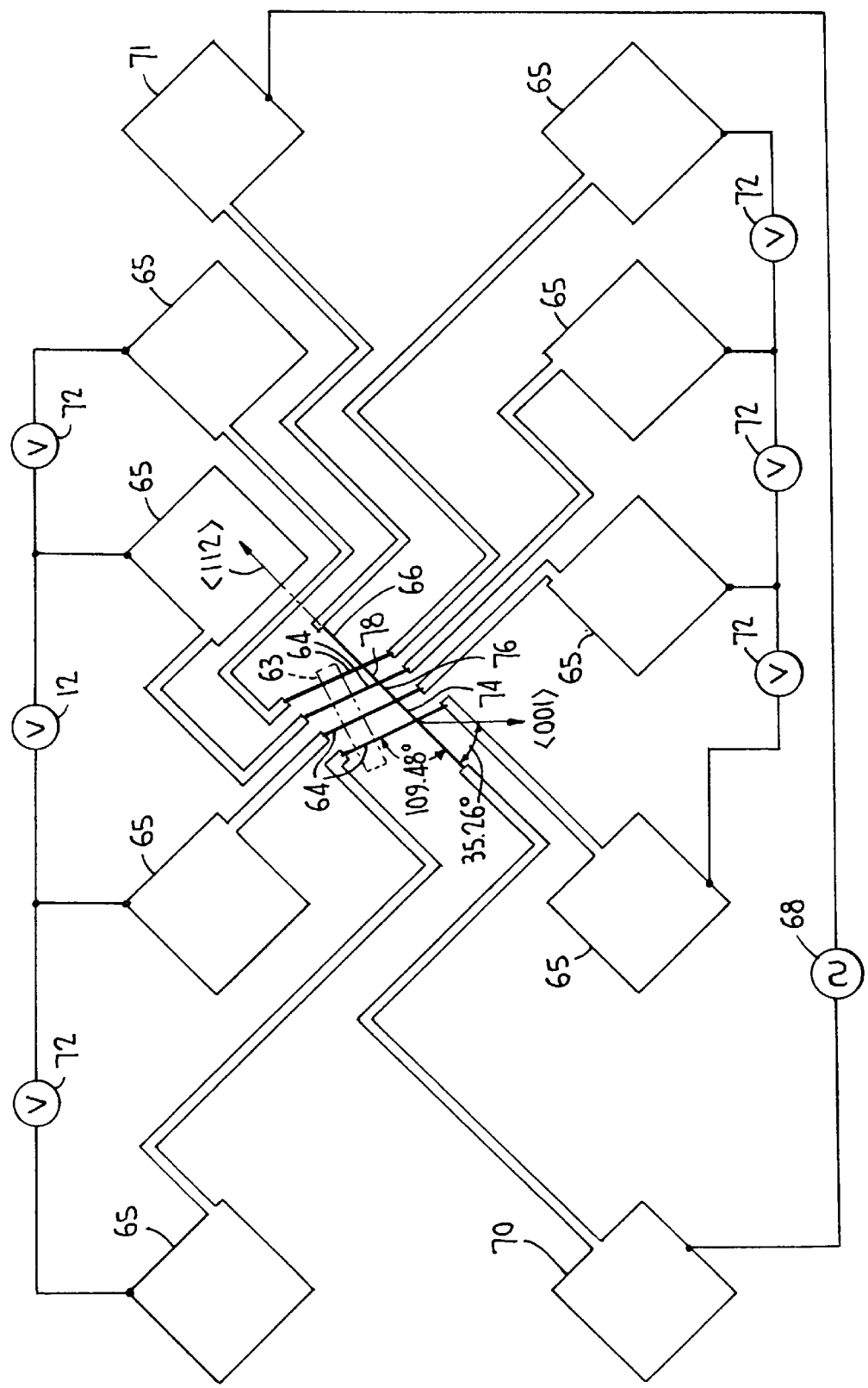

MONOCRYSTALLINE TEST AND REFERENCE STRUCTURES, AND USE FOR CALIBRATING INSTRUMENTS

CROSS REFERENCE TO RELATED APPLICATIONS

This application is a continuation-in-part of U.S. patent application Ser. No. 08/409,467, filed Mar. 23, 1995, now U.S. Pat. No. 5,684,301 which is a continuation-in-part of U.S. patent application Ser. No. 08/382,973 filed Feb. 3, 1995, now U.S. Pat. No. 5,617,340, which is a continuation-in-part of U.S. patent application Ser. No. 08/236,202, filed Apr. 28, 1994, now U.S. Pat. No. 5,602,492, which is a continuation-in-part of Ser. No. 07/852,439, filed Mar. 13, 1992, now U.S. Pat. No. 5,383,136.

FIELD OF THE INVENTION

This invention relates to improved test and reference structures, including calibration reference grids, fabrication techniques thereof, and methods for using the improved structures for calibrating different types of instruments used to measure the location, width, spacing, or like geometrical characteristics of conductive or other features, features in mask tools, or comparable patterned elements, e.g., as used or formed during semiconductor manufacturing operations.

BACKGROUND OF THE INVENTION

As improvements in semiconductor manufacturing technology continue to reduce the size of features formed on substrates in manufacture of integrated circuits and the like, demands on the dimensional metrology used to evaluate the accuracy of manufacturing processes and the like increase accordingly. There is a particular need for test structures and methods for calibrating various types of instruments used for measuring the locations, widths, and spacing of conductors and other structures formed on substrates, features of masks and other tools used to fabricate such structures, and like geometrical characteristics of similar structures.

More particularly, in grandparent application Ser. No. 08/382,973, now U.S. Pat. No. 5,617,340, the problem of measuring the distance between two parallel conductors is addressed in detail. Distances between spaced conductors, and the widths of such conductors, are commonly measured using an imaging instrument, such as an optical microscope or an electron microscope, detecting radiation reflected or scattered by the element to be imaged. In some cases, these instruments may detect radiation transmitted through a radiation-transparent substrate on which the feature is formed.

In many cases of interest, such features are patterned by photolithographic selective removal processes. Where the features are to be conductive, such processes essentially involve the steps of forming a continuous thin layer of semiconductive material, conductive metal, or the like over a substrate, covering the layer with a photoresist mask patterned to define areas of the layer which are to remain, exposing this assembly to an etchant which removes the portions of the layer not protected by the photoresist mask, and then removing the mask, so that only the patterned areas remain of the original continuous layer. Similar techniques are used to form calibration reference grids and like structures used for instrument calibration and other metrologic purposes.

Ideally (from the point of view of accurate metrology as well as that of product manufacture itself), conductors and like features formed on a substrate using such selective removal processes would exhibit regular cross-sectional shapes. For example, the side walls of such ideal conductors might rise at exactly right angles from the substrate to meet the top of the remaining planar upper surface of the layer of conductive material at another right angle. Light would be reflected as if from a mirror from the flat upper surface of the patterned feature to be imaged, and would be reflected in a differing manner from the side walls of the feature, enabling the "corners" of the side wall to be optically detected, and the width, spacing, and like geometrical characteristics of such features accurately measured.

In practice, the side walls of the conductors (and other features) tend to exhibit irregular side wall angles and roughness due to, for example, under-cutting, local variations in the etch rate, and the like. These irregularities in formation of the side walls render the width of the conductor somewhat variable and ill-defined, and similarly complicate evaluation of the width of a feature or the spacing of two features having such irregular side walls using an imaging instrument, for example, an optical microscope, where radiation reflected from or transmitted past the structure is to be detected. Particularly for providing a certifiable reference structure, it would be desirable to provide a method of fabricating a feature on a substrate wherein the side walls of the features were regular and substantially planar, so that the widths, spacing, and other geometrical characteristics of the features thus formed might be unambiguously specified to a high degree of accuracy; such a structure could then be used to calibrate other instruments, such as optical or electron microscopes used in manufacturing processes.

More specifically, there are disclosed in the grandparent application several types of test structures for cross-calibrating imaging instruments, such as electron or optical microscopes, with respect to instruments providing electrical measurements of the same test structure. "Electrical measurements", as referred to in the grandparent application, include measurements made by forcing a current along a conductive member and measuring voltage drops between spaced locations therealong, as well as capacitative, inductive, or impedance measurements of the geometrical characteristics of the conductor.

The parent application Ser. No. 08/409,467 discusses the desirability of a similar cross-calibration capability with respect to scanning tunneling microscopes (STMs), including in the latter term all types of instruments wherein a tunneling current passes between a probe moved over a conductive object being inspected and the object, the tunneling current varying with juxtaposition of the probe to each individual atomic site of the structure being inspected. Such microscopes are becoming increasingly useful for "atomic lattice counting" as a means of measuring the dimensions of a structure, for example. The parent application provides test structures and methods for cross-correlation of an SPM measurement with an electrical measurement, or with an imaging-instrument measurement.

The parent application also recognized the fact that an electrical measurement of "linewidth", i.e., the width of an elongated conductor formed on a substrate, typically provides a value for the average width of the entire conducting line, while a scanning electron microscope (SEM) usually measures linewidth using an algorithm based on calibration using a non-electrically-calibrated grating, and optical and STM methods provide a local "snapshot" of the linewidth at a specific point of measurement. More specifically, optical measurements attempt to provide a measurement of linewidth using two defined points at both edges of an image of the line, followed by analysis of the output signal from an optical detector to calculate the linewidth. Due to the irregularities normally exhibited by the sidewalls of conductors on a substrate, an image of the conductors formed using an optical measurement instrument will exhibit substantial indefiniteness as to the exact location of the edges of the sidewalls of the conductor. Modeling is used to determine where the edges of the line are likely to be. It would be preferable to avoid the uncertainty inherent in the theoretical modelling step.

The art recognizes generally that these various techniques for measuring the same physical parameter give varying results. To a degree, these are explained by the intrinsic characteristics of the different measuring techniques; these differences are also likely due in part to irregularities in the line being measured.

The parent application discloses and claims test structures exhibiting a better-defined physical structure, and methods of their fabrication, eliminating many of the sources of cross-correlation errors. More specifically, in the parent application, highly regular test structures are formed by selective etching of a monocrystalline precursor. For example, the sidewalls of conductors formed of monocrystalline materials on an insulative substrate can be fabricated to coincide with a single crystal lattice plane. The parent application teaches methods for using such highly-regular test structures for cross-calibration of optical instruments using electrical measurements.

As indicated, it will be recognized that the same problems inherent in measuring linewidth, and specifically in correlating measurements of linewidth made using one measurement technique with comparable measurements made using another technique, exist equally in connection with measurement of other geometrical characteristics of the structure, such as measurement of the spacing between adjacent conductors on a substrate, or of the overlay of different components of a composite structure formed in a succession of patterning steps. Here again, precision test structures would enable better correlation of various types of measurement instruments, as needed to evaluate more demanding production technologies being developed.

The present invention addresses a further specific need of the art. Optical "coordinate-measuring" instruments are widely used during semiconductor manufacture for measuring the distances between features in a plane, e.g., between the opposed side walls of a conductive line, between two parallel lines, between the corners defining the extent of a plane, or other features formed on a semiconductor substrate, a photolithographic mask, or the like. Such measurements are normally made by aligning fiducial marks (e.g. crosshairs) on a reticle of the instrument with the features the spacing of which is to be measured. Typically, a fiducial mark may be aligned with a centerline of a first feature and the object physically moved with respect to the instrument until the mark is similarly aligned with a second feature. Equivalently, pairs of spaced fiducial marks on the reticle may be simultaneously aligned with features on the object to be inspected, and the spacing of the features determined as a function of the magnification of the instrument.

Such measurement processes are only accurate if the magnification and the components for measuring motion of the optical instrument are satisfactorily calibrated, and if the fiducial marks on the reticle are reliably aligned with the features the spacing of which is to be measured. Generally similar instruments are used for placement of tools with respect to work in process, i.e., alignment of successive masks used in semiconductor production, and suffer from similar sources of inaccuracy.

Such instruments are commonly calibrated in two dimensions by alignment of fiducial marks on the reticle with spaced pairs of features on a reference object. Typically, this will be done by moving the reference object separately in two dimensions using x and y lead screws or similar mechanisms. At present there are no certified reference standards available that are suitable for conveniently calibrating such optical instruments in two dimensions.

More specifically, in order that the optical instrument can be used to measure dimensions of planar objects, such as photolithographic masks, semiconductor wafers or the like, in two dimensions, the instrument must be calibrated in two dimensions. However, the calibration objects now available for such use are not certified by reference to a suitable international standard.

More specifically, to properly calibrate such an instrument would require a reference grid defining a number of points in a plane, the distance between the points in two dimensions having been certified by measurement using an international standard measuring apparatus. Certified one-dimensional length scales are available, but are not satisfactory for calibrating an optical instrument in two dimensions, as is desired.

As noted above, the parent application (as well as various prior art disclosures) recognize that extremely precise structures—structures much more precise than the tools used in their fabrication—can be made by preferential etching of monocrystalline materials, and that this fact can be usefully employed in fabrication of test structures and the like. More specifically, it is known that structures of atomically-accurate planarity can be preferentially etched in monocrystalline silicon, as commonly employed as the starting material for semiconductor components. In the parent, this fact is used to form, for example, extremely precise elongated structures on a transparent substrate. The width of such structures can be measured by both electrical and optical techniques, enabling calibration of an optical instrument by reference to certifiable electrical measurements of the same structure.

As indicated, several prior art references suggest employment of the fact that monocrystalline materials may be preferentially etched along defined crystal planes to fabricate test structures, calibration structures, and like reference tools of great accuracy. Leone et al in "Fabricating Shaped Grid and Aperture Holes", *IBM Tech. Disc. Bull.*, Vol. 14, No. 2, pp. 417–418 (1971) suggest that preferential etching of such materials can be used to form essentially perfect square apertures, and that these could be used to form a highly accurate calibration grid.

Young et al U.S. Pat. No. 4,885,472 discusses difficulties encountered in calibrating particle beam lithographic equipment using relatively inaccurate metal calibration grids. The improvement suggested by Young is principally in replacing the metal grid with a grid of silicon coated with a conductive metal layer, e.g., gold. The Young grid appears to be fabricated by preferential etching of a monocrystalline silicon precursor, and in essence comprises a number of the square apertures of Leone et al disposed in a two-dimensional array. The members remaining after the apertures are formed by preferential etching may each be expected to be atomically accurate, that is, the "wall" of each side of each aperture in the monocrystalline material will consist of a single crystal plane. However, as the walls of the various apertures making up the grid are not formed in a continuous etching step, they cannot be assumed to be coplanar, i.e., to correspond to the same crystal planes.

Accordingly, while certified measurements could be made along orthogonal lines of the spacing of the walls of the individual apertures making up the Young grid, these measurements would be insufficient to certify the locations of the intersections of the members defining the apertures. Hence the Young grid cannot be employed as a certified structure having a number of points at defined locations in a plane, and cannot be used in the manner described above to calibrate an optical instrument in two dimensions with respect to a certified standard for length. Neither Leone et al nor Young discloses a method of certifying the calibration grids thus formed, i.e., neither reference explains how the grids are to be o to a known reference standard.

U.S. Pat. No. 5,043,586 to Guiffre discloses a method for making calibration tools, in this case, artifacts having a number of metallic grid lines embedded in and coplanar with a substrate of a different material. A reactive ion etching process is used to form recesses in the surface of the substrate, which are then filled with the metal of the lines. By making reference to the Leone et al disclosure discussed above, Guiffre suggests forming such lines in a monocrystalline silicon substrate, such that extremely accurate lines would be formed. However, Guiffre's structure is not transparent and hence would not be useful in calibrating transmissive optical instruments, as are widely used; instead, only instruments operating on a back-scattering principle can be calibrated thereby. Furthermore, Guiffre's grid would only be suitable for calibrating an instrument with respect to measurements made in a single dimension; the test grid would have to be rotated through 90°, and the process repeated, in order to calibrate a two-dimensional measuring device. Finally, Guiffre does not disclose a method of certifying the calibration grids thus formed, i.e., does not indicate any method of comparing the actual spacings of the lines to a certified reference measurement.

Toda U.S. Pat. No. 5,264,696 shows formation of a cantilever probe structure for scanning probe microscopy. The Toda probe is formed using a precursor material comprising a silicon dioxide layer formed within a monocrystalline silicon substrate. A similar precursor material is used in certain embodiments of the present invention.

Other references generally pertinent to the subject matter of this application include Hatsuzawa et al, "Critical Dimension Measurements by Electron and Optical Beams for the Establishment of Optical Standards", *Proc. IEEE Conf. Microelectronic Test Structures*, Vol. 5, 180–184 (1992), showing formation of a deeply-finned structure by preferential etching of a monocrystalline silicon member. This structure is then used for cross-correlation of optical and scanning electron microscope measurements. See also Sickafus et al U.S. Pat. No. 4,808,260 showing etching of monocrystalline materials to form accurate apertures, e.g., for fluid flow nozzles. U.S. Pat. No. 5,485,080 to Larrabee et al shows nested quadrilateral structures formed on substrates which resemble structures formed according to the present invention, but used for entirely different purposes.

The art does not teach a two-dimensional structure formed on a transparent substrate having atomically-precise planar surfaces, which could be certified using a one-dimensional reference measuring instrument, and which would be useful in calibrating optical instrumentation in two dimensions.

OBJECTS OF THE INVENTION

It is therefore an object of the invention to provide improved test and reference structures allowing atomically-accurate members to be formed, enabling accurate cross-correlations of measurements of linewidth and line spacing to be made using optical imaging instruments, electrical instruments, scanning probe microscopes, and variations thereof, and thus allowing calibration thereof by reference to certified standards.

It is a further object of the invention to provide improved methods of cross-correlating measurements of geometrical characteristics, e.g., linewidths and line spacings of patterned structures on substrates, in particular wherein the features of the patterned structure are formed more precisely and reproducibly than heretofore possible.

It is a more specific object of the invention to provide a test structure wherein a patterned structure, which may be conductive or non-conductive, is defined on a transparent insulative layer, the structure having planar side walls meeting a planar upper surface at a predetermined angle, such that, for example, the width of the structure can be readily determined using transmissive optical measurement techniques, for cross-correlation to scanning probe microscopic measurements or, if conductive, to electrical measurements of the same geometrical characteristic.

It is a more specific object of the invention to provide a calibration reference grid structure comprising nested quadrilaterals each comprising pairs of spaced precisely parallel lines having atomically planar side walls, whereby such a structure can be certified using a one-dimensional reference measuring instrument and used to calibrate a conventional two-dimensional optical measuring instrument in a two operations.

Another object of the invention is to provide a series of spaced parallel members provided without substrate, for calibration and other purposes.

SUMMARY OF THE INVENTION

The above needs of the art and objects of the invention, and others appearing below, are met by the present invention. A first embodiment begins with a monocrystalline starting member, such as a silicon wafer having a specified crystal orientation, having an insulating layer formed below its surface. For example, a silicon dioxide insulating layer can be formed below the surface of a monocrystalline silicon substrate by the so-called SIMOX process, which stands for "Separation (or, equivalently, Silicon Isolation) by the Implantation of Oxygen". Such a precursor is shown by the Toda patent. After formation of the insulative layer, the monocrystalline layer remaining on the surface is then patterned using standard photolithographic techniques, and a preferential etchant such as KOH or NaOH used to remove the monocrystalline material along the crystal planes, thus delineating a patterned silicon member having planar side walls on the insulative layer. The result is a patterned monocrystalline structure having side walls meeting the upper surface at angles defined by the crystallographic orientation, and having regular features suitable for well-defined electrical, scanning probe microscopy, and imaging-instrument measurements of linewidth, line spacing and the like.

Various structures of differing materials can be formed using generally similar process steps, depending on the ultimate use to be made of the structure. For example, if strictly optical measurements are to be made, the silicon can be allowed to remain in its normal semiconductive state; if electrical measurements are to be made, the silicon member can be doped to increase its conductivity. The fact that monocrystalline silicon can be thus formed very precisely can also be used to create "casting patterns" that can in turn be used to form highly accurate structures of other materials.

For example, optical measurements, e.g. of the widths of conductive lines on a substrate, can be correlated to electrical measurements thereof as a step in calibrating the optical instrument. The precise nature of the structures formed using the monocystalline material render optical measurements more accurate; while as the slopes of the side walls are known, and the planar nature of the walls is a given, electrical testing, e.g., current-forcing techniques, can be performed to certify the spacing of the side walls, that is, the linewidth, thus completely characterizing the structure. Other types of instruments can then be calibrated accordingly. Similar techniques can be used to evaluate other geometrical characteristics of a structure, for example, the spacing of various features, or the overlay of components of features formed in successive fabrication steps.

In a particularly preferred embodiment, the oxygen-implanted silicon insulative layer is annealed to form an amorphous layer of insulative silicon dioxide glass within the substrate, and the substrate material is selectively removed from the opposite side thereof, leaving one or more transparent insulative windows below the structure. Transmissive optical measurements and electrical measurements using capacitative techniques can then be made, for example, of linewidth and line spacing of the features of the structure. Similarly, because preferential etching of the monocrystalline material along crystal planes forms a very accurate structure, "atomic lattice counting" techniques such as scanning tunneling microscopy (STM) may be used to provide yet another measure of the width of the lines, for cross-calibration of STM instruments as well. The substrate may also be removed completely, leaving the precisely patterned lines extending across a small open "window" for other types of measurement.

In a particularly preferred embodiment of the invention, calibration reference grids, each comprising a plurality of nested quadrilaterals, each comprising two pairs of straight lines meeting at angles defined by the orientation of the monocrystalline starting material, are formed using the techniques outlined above. The sidewalls of the lines of the quadrilaterals meet the substrate at angles also defined by the orientation of the monocrystalline starting material. The respective spacing of the lines of each pair are measured using a certified one-dimensional measuring instrument, and the locations of their intersections are calculated accordingly. Particularly if formed on a transparent substrate, these structures are convenient for calibrating two-dimensional optical imaging instrumentation.

BRIEF DESCRIPTION OF THE DRAWINGS

The invention will be better understood if reference is made to the accompanying drawings, in which:

FIG. 8 shows a plan view of and a schematic arrangement for measuring geometrical characteristics of test structures according to the invention, using current-forcing electrical techniques;

DESCRIPTION OF THE PREFERRED EMBODIMENTS

Figure 1:
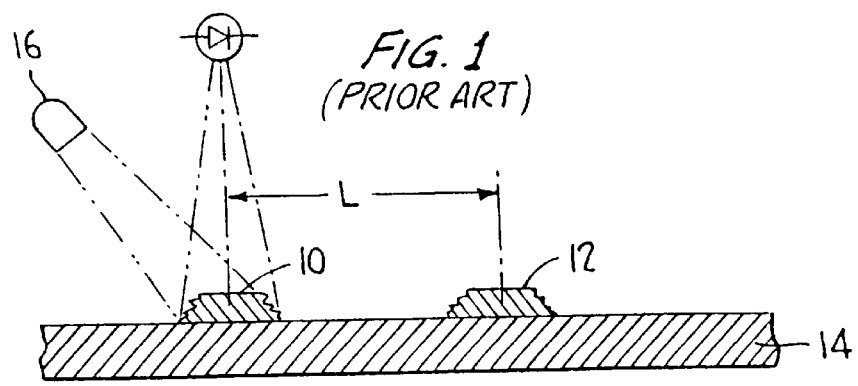
FIG. 1 shows a cross-sectional view through two conductors formed on a substrate according to the prior art, and illustrates a typical method of optical inspection thereof.

Due to the continued growth in the semiconductor industry over the last forty years, practically all of which has centered on silicon-based transistors, followed by integrated circuits, and later by increasingly large-scale integrated circuits, monocrystalline silicon as used throughout the semiconductor industry is one of the best-characterized materials known to man. In particular, it is well known that certain reagents, notably potassium hydroxide (KOH) and sodium hydroxide (NaOH), preferentially etch monocrystalline silicon along the crystal planes. That is to say, the monocrystalline silicon material when thus processed is etched away precisely along the planes of the crystal structure, such that the etching process can be controlled to remove material in the direction of one crystal plane, while little or no material removal takes place along another crystal plane. More specifically (using notation conventional in the art herein and on the drawings to describe the orientation of the crystal planes of the test structures of the invention), the material oriented along the (111) plane is etched significantly more slowly than material oriented along the other planes.

Preferential etching of monocrystalline materials as a means of delineating structures has been suggested for use in fabrication of various types of structures, notably the "micromachines" which are often hailed as forerunners of a new "nanotechnology". The preferential etching characteristics of silicon (also exhibited by other monocrystalline materials) have also been widely employed in connection with metrology for use by the semiconductor industry. See generally, "Critical dimension measurements by electron and optical beams for the establishment of linewidth standards", Hatsuzawa et al, *Proc. IEEE* 1992 *Int. Conference on Microelectronic Test Structures*, Volume 5, March 1992, pp. 180–184.

Hatsuzawa et al teach the manufacture of artifacts having very precisely defined structures using the preferential etching characteristics of monocrystalline silicon, and suggest use of such structures for comparison of electron and optical beam linewidth measurements, that is, for cross-correlation of linewidth measurements made using these types of imaging instruments. The Hatsuzawa structure is a "deep-comb" structure in which vertical "fins" of material 0.5–1.0 µm wide stand 10–20 µm above the substrate, useful as a diffraction grating for imaging instrument measurements.

However, Hatsuzawa et al does not provide a structure whereby measurements made using optical or electron beam imaging instruments can be correlated with, for example, measurements made using electrical techniques. "Electrical techniques" as used herein include all manner of measurement techniques wherein the structure to be measured must be electrically isolated from the structure on which it is formed. For example, a current may be forced along a conductor and a voltage drop measured between specified points therealong to determine the resistance of the structure; the sheet resistance of the material can then be extracted, and the linewidth of the conductor calculated. Equivalent "electrical techniques" for measuring geometrical characteristics of a conductor include exposing the conductor to an RF or other signal, and measuring the capacitance, impedance, or inductance of the conductor.

Measurement of a geometrical characteristic, such as the linewidth or line spacing, using such electrical techniques requires that the structure being evaluated be electrically isolated, e.g., by being disposed on an insulative substrate. The structures of Hatsuzawa et al are formed on a continuous silicon substrate, such that all portions thereof are in electrical contact with one another, and thus can not be evaluated by measurements of this kind. Moreover, although scanning probe microscope (SPM) measurements do not require the object being inspected to be electrically isolated from the substrate (or other structure) on which it is formed, the deep comb structure of Hatsuzawa is also generally unsuited for SPM measurements, which are usually amenable only for the measurement of linewidths (for example) of relatively low-relief structures.

As discussed above, and as discussed in further detail in the parent and grandparent applications, prior art optical techniques for measuring geometrical characteristics of conductive features, such as the width of conductors formed on a semiconductor substrate, have often been rendered imprecise due to the difficulty inherent in optical definition and location of the exact edge of a conductor on a substrate. For example, referring to FIG. 1, suppose two conductors 10 and 12 are formed on a substrate 14, and it is desired to measure their spacing L. Using an optical instrument, radiation emitted by a source 16 is reflected from the conductors 10 and 12 and detected by a detector 18. The spacing L is typically measured by locating the optical instrument over the apparent center line of one of the conductors 10, and using a lead screw device or the like to move the optical instrument until the center line of the other conductor 12 is similarly apparently aligned, thus measuring the distance.

As noted, in ordinary conductor formation processes, the side walls of the conductors 10 and 12 are typically somewhat irregularly trapezoidal, preventing precise definition and location of the center lines of the conductors 10 and 12 using reflected optical techniques, because the light reflected from the side walls thereof contributes in an irregular and unpredictable fashion to the total light detected. Accordingly, this process is inherently inaccurate. It was in order to solve this problem, of course, that Hatsuzawa et al proposed preferentially etching monocrystalline silicon material, so as to provide essentially vertical walls in the structure being measured; this enables better optical measurements of the spacing L of adjacent conductors 10 and 12 and similarly better measurements of the width of individual conductors.

However, as noted, because the elements being measured are conductive, and are formed on a conductive substrate, it is not possible to make corresponding electrical measurements of the Hatsuzawa structure. Accordingly, Hatsuzawa's structure does not permit electrical measurements to be made and compared to optical measurements, and cannot be used to calibrate preexisting optical measuring instruments by reference to electrical measurements of the width of the same test structure, as would be desired. Similarly, as noted above, Hatsuzawa's structure comprises comparatively deep "fins", e.g., 10–20 µm high by 0.5–1.0 µm wide, for use as a diffraction grating, and is not generally suitable for SPM measurements, which are usually possible only with relatively low-relief structures. Finally, Hatsuzama's structure is one-dimensional and would not be convenient for calibrating two-dimensional imaging instruments.

More specifically, a test structure is needed having a geometrical characteristic which can be certified by a metrological standards organization, such as the National Institute of Standards and Technology, the assignee of this application, using, for example, an electrical or SPM technique. Such a certified test structure could then be supplied to users of preexisting imaging instruments, to enable calibration of the latter. A two-dimensional structure, having pairs of spaced parallel lines meeting at intersections that can be precisely located, is particularly preferable.

Figure 2:
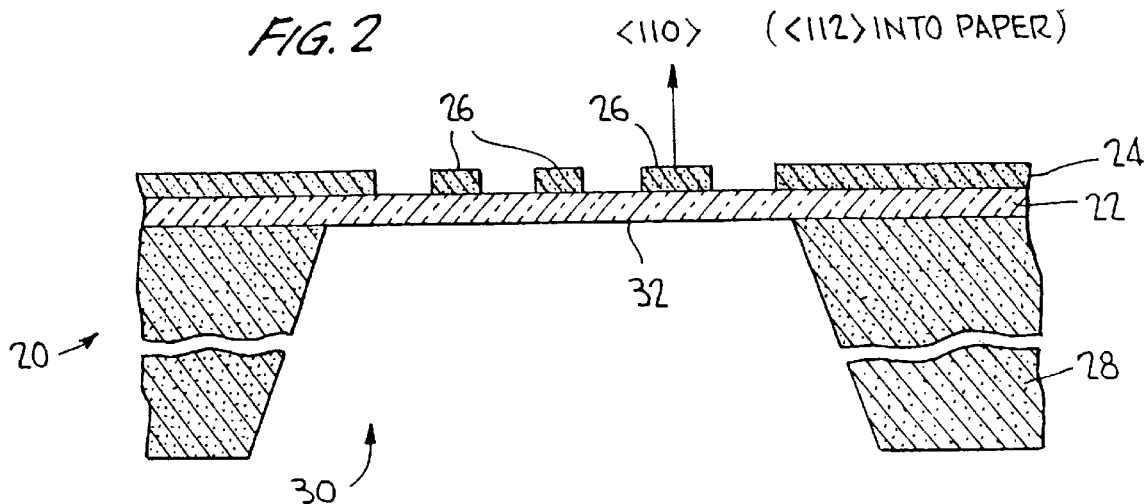
FIG. 2 shows a cross-sectional view through a first embodiment of a test structure formed according to the present invention.

FIG. 2 shows a structure according to a first aspect of the invention which addresses these deficiencies of the art and meets a number of the objects of the invention as listed above. In FIG. 2, a test structure 20 comprises an insulative layer 22. On top of the insulative layer 22 are formed a number of individual elongated conductive members 26 formed by processing a monocrystalline layer 24 to remove material preferentially along the planes of the crystal. In the embodiment shown, the insulative layer 22 and the patterned conductors 26 are formed on a substrate 28, although substrate 28 is not required in every embodiment of the invention.

In the preferred embodiment of the invention, the test structure 20 is formed of a monocrystalline silicon wafer, doped before or after processing according to the invention as needed to provide sufficient electrical conductivity for the intended test methods. A suitable wafer has an insulative layer 22 formed at a controllable distance below the surface of the wafer by a known process such as implantation of oxygen ions, followed by annealing. This process, well known and referred to as SIMOX in the art, essentially forms an insulative layer 22 of amorphous silicon dioxide, that is, glass, beneath the surface of the wafer, such that a monocrystalline layer 24 remains on the surface of the wafer. An alternative process is referred to as BESOI, "Bonded and Etched-Back Silicon on Insulator". Insulative layer 22 and monocrystalline layer 24 are both on the order of 200 nm thick. Additional monocrystalline material may be added by epitaxial deposition, if needed. See the Toda patent discussed above.

The monocrystalline surface layer 24 is then processed using known techniques to form the patterned test structure 26 desired. In a simplified version of a typical processing sequence, the surface layer is first provided with a silicon nitride coating, which is then coated with a photoresist material, which in turn is exposed to light in a mask corresponding to the desired pattern and appropriately oriented with respect to the crystalline orientation of the wafer. The resist is then developed and the "hard mask" of silicon nitride is removed by plasma etching, exposing unwanted components of the monocrystalline surface layer 24, which are then etched away using a preferential etchant such as KOH or NaOH. Other etching processes, in particular, reactive ion etching, and additional patterning operations may be performed as necessary. As is known to the art, such processes preferentially etch the monocrystalline layer 24 along the crystalline planes of the material, such that the side walls of the patterned conductive layer 26 meet the substrate and the upper surface thereof at known angles, depending on the orientation of the monocrystalline material.

Figure 6:
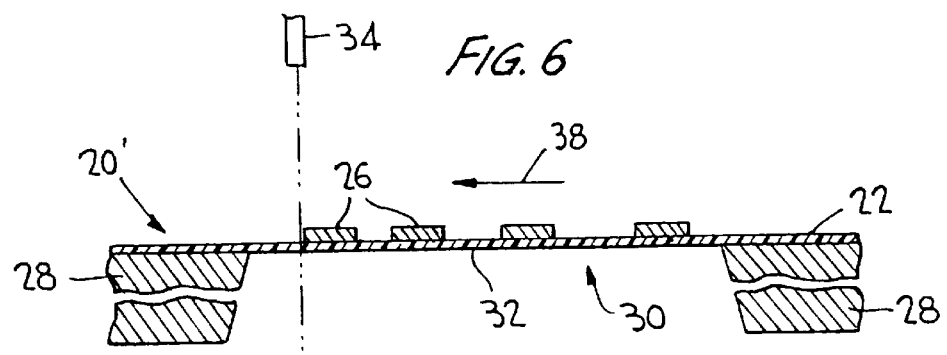
FIG. 6 shows a cross-sectional view of a test structure according to the invention, and a schematic arrangement for their inspection using an optical instrument in a transmissive mode.

In an important preferred embodiment of the invention, one or more portions of the silicon substrate 28 are removed as indicated at 30, leaving transparent glass windows 32 beneath the patterned conductors 26. This structure is useful as indicated in FIG. 6 for transmissive-light inspection of the patterned conductors 26. Specifically, a light source 34, such as a laser, is directed at the test structure 20 from one side, and a detector 36 is positioned on the other side. Light from the light source 34 passes through the transparent window 32 but is reflected or scattered from the patterned conductors 26; accordingly, if the test structure 20 is moved with respect to the light source 34, as indicated by arrow 38, the signal from detector 36 provides a direct indication of the width of the patterned conductors 26, and also, of course, of their spacing.

Figure 5:
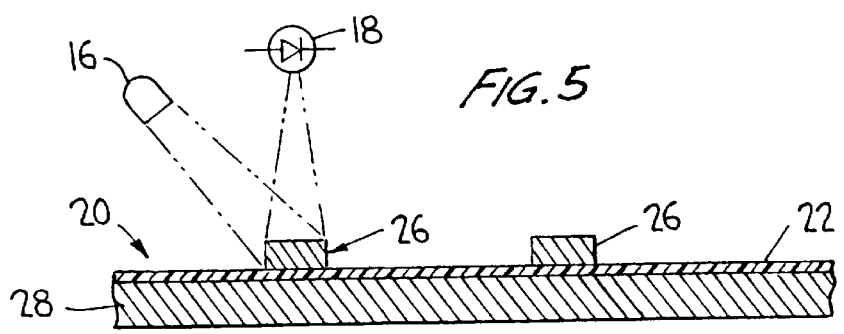
FIG. 5 shows a cross-sectional view of conductors formed on a substrate according to the present invention, and a schematic arrangement for their inspection using a reflective optical instrument.

The test structure of the invention is also suitable for reflected-light inspection as indicated in FIG. 5. In this case, the inspection is performed as in the prior art as shown in FIG. 1, with the exception that the preferentially-etched side walls of the structure provide an unambiguous identification of the location of the side walls of the feature, e.g., for subsequent processing by the image-processing algorithm of the instrument to be calibrated. Further, because the patterned conductors 26 are disposed on insulative layer 22, according to the invention, such reflected-light measurements can be cross-calibrated with respect to electrical measurements; this was not possible using the Hatsuzawa structure, as noted above.

Figure 7:
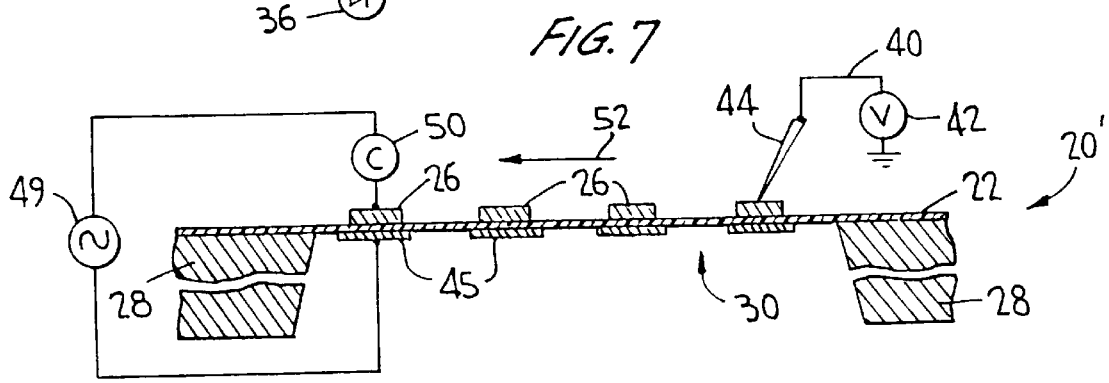
FIG. 7 shows a cross-sectional view of a test structure formed according to the invention, and a schematic arrangement for its inspection using capacitative and/or scanning microscopic probe techniques.

Removal of the portion 30 of the substrate 28 beneath the patterned conductor 26 is not required for performance of reflected-light measurements, and is also not necessary to perform current-forcing electrical measurements as discussed below in connection with FIG. 8. However, an embodiment of the test structure of the invention having had portion 30 of the substrate removed is useful in connection with certain additional electrical measurement techniques, as shown in FIG. 7. FIG. 7 illustrates schematically two different measurement techniques which could theoretically be used simultaneously in a single test arrangement, as shown, although in practice this would normally be unnecessarily complicated.

In FIG. 7, a scanning tunneling microscope—(STM) (including various types of microscopes sometimes referred to as scanning probe microscopes) indicated generally at 40 is provided. A potential difference indicated at 42 is provided between a probe 44 having an atomically-sharp tip, and the patterned conductors 26. When the probe 44 is brought sufficiently close to the patterned conductors 26, a tunneling current flows therebetween. The rate of tunneling current flow is sufficiently sensitive to the surface characteristics of the patterned conductors 26 that individual planes in the atomic lattice can be identified and counted by appropriate analysis of variation of the tunneling current as the test structure is moved past the probe, as indicated by arrow 52. According to the invention, measurements of the width of patterned conductors 26, their spacing, and further geometrical characteristics made using the scanning probe microscope 40 can be correlated according to the invention with similar measurements made using other techniques.

One such technique involves capacitative measurement of the width of the conductors. As also shown in FIG. 7, a signal source 49 and a capacitance meter 50 are connected between the patterned conductors 26 and metal films 45 on the rear of insulative layer 22. In this arrangement, insulative layer 22 constitutes a dielectric, so that a capacitance signal varying with the width of the patterned conductors 26 can be detected by capacitance meter 50.

Figure 3:
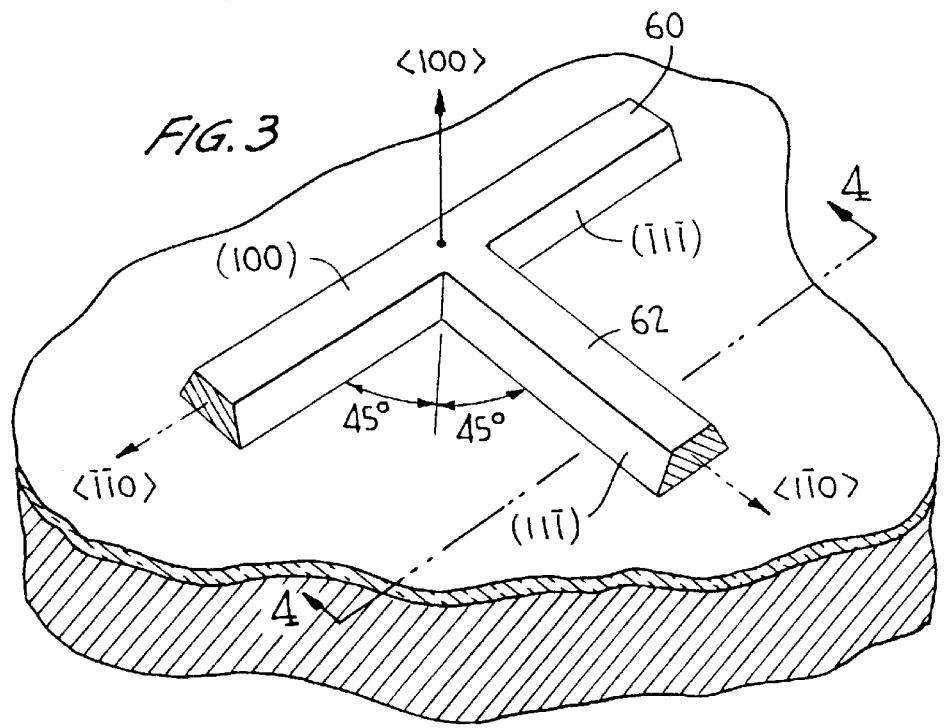
FIG. 3 shows a perspective view of an intersection between two conductors formed on a substrate according to a second embodiment of the present invention.
Figure 4:
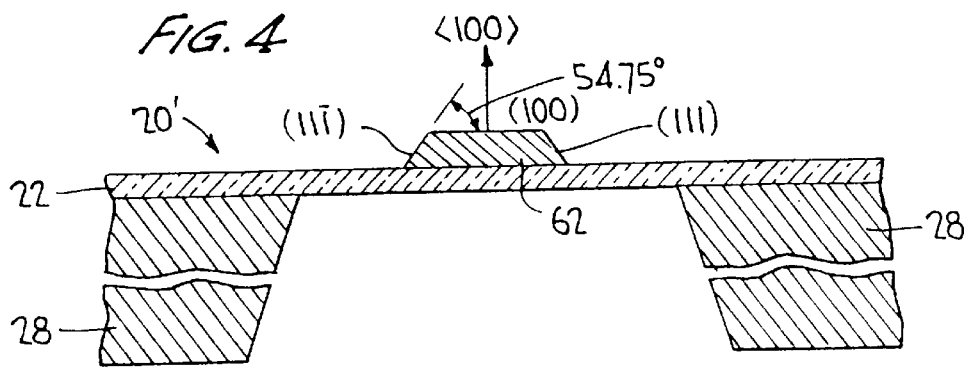
FIG. 4 shows a cross-sectional view along line 4—4 of FIG. 3.

Returning now to discussion of FIGS. 3 and 4, FIG. 3 shows a perspective view of a portion of a patterned test structure formed according to the invention, while FIG. 4 shows a cross-section of one conductor of the structure, taken along line 4—4 of FIG. 3. As indicated above, it is well known in the art that monocrystalline silicon material can be processed so as to be preferentially etched with respect to the crystal planes. Depending on the orientation of the monocrystalline starting material, that is, depending on the orientation of the upper surface exposed to the etchant, conductors formed on a substrate may have vertical side walls, as indicated in FIG. 2, or may form an angle of substantially 54.75° to the plane of the substrate, as indicated in FIG. 4. As discussed below in connection with FIG. 8, it is convenient in connection with current-forcing electrical measurements to form a patterned structure comprising an elongated bridge conductor intersected by a number of taps. The taps are preferably similarly formed along preferential etching planes, such that the taps intersect the bridge conductor at angles similarly depending on the crystal orientation; this angle may be 90°, as shown in FIG. 3, or may be different, as shown in FIG. 8.

More specifically, as shown in FIGS. 3 and 4, when the orientation of the monocrystalline material is such that the <100> direction of the crystal is up, that is, perpendicular to the surface, the side walls of the patterned conductors form an angle of 54.75° with respect to the substrate, as shown in FIG. 4, while taps 62 will intersect an elongated conductor 60 aligned along the <110> direction at 90°; that is, the taps will lie along the <110> direction, as shown in FIG. 3. (As above, the notation used herein and on the drawings to describe the orientation of the crystal planes of the test structures of the invention is conventional in the art.) By comparison, if the crystal is oriented with the <110> direction perpendicular to the substrate, as indicated in FIG. 2, the side walls of the patterned conductors 26 will be at 90° to the substrate, but taps 64 intersect an elongated bridge conductor 66 at angles of 109.48°, as indicated in FIG. 8.

FIG. 8 shows a plan view of one embodiment of a test structure according to the present invention, and also shows connections useful in practice of current-forcing electrical measurement methods disclosed in the parent and grandparent applications. The same structures, or equivalents thereto corresponding to the crystal orientation of FIGS. 3 and 4, may be used for these and other types of electrical measurements as discussed herein. As indicated, such test structures are designed for electrical measurements of the geometrical characteristics of the structure formed. For example, a current from a source indicated at 68 is forced between pads 70, 71 at either end of an elongated bridge conductor 66. Voltages may be measured as indicated at 72 between specified points therealong, e.g., by connections to pads 65 connected to taps 64, as indicated at 72, to determine the resistance of individual segments, e.g., 74, 76, 78, of conductor 66. Such measurements may be employed as disclosed in the predecessor applications.

According to the present invention, such current-forcing measurements of geometrical characteristics of the test structure formed from the monocrystalline material can then be cross-correlated to optical measurements, e.g., made as shown in FIGS. 5 or 6. Capacitative, SPM, or other measurements, made as shown in FIG. 7, can also be correlated to one another or to other types of measurement. In particular, the taps 64 may be aligned parallel to one another, defining a "frame-in-frame" structure as indicated at 63 as conventionally used for optical measurements. Such cross-correlation of various instruments can specifically be used to evaluate measurements of overlay as measured by the differing instruments.

It will be appreciated that according to the invention, very precise test structures can be formed by virtue of the fact that certain monocrystalline materials, notably monocrystalline silicon, are preferentially etched along the several crystalline planes by appropriate etching processes. More particularly, structures having precisely defined cross-sectional shapes may be formed on insulative substrates according to the invention, to enable electrical measurements thereof. Still more particularly, if the insulative layer is a silicon dioxide glass, the substrate beneath the insulative layer may be removed to enable transmissive-optical measurement of the geometrical characteristics of the conductors. Removal of the substrate beneath the insulative layer also allows electrical measurements requiring access to both sides of the insulative layer, e.g., capacitative measurements, to be performed.

Techniques for formation of an insulative layer within a monocrystalline silicon wafer so as to form a test structure precursor 20 to be patterned to form a test structure, as shown in FIG. 2, techniques for annealing the insulative layer to form a radiation-transmissive glass layer, and techniques used to pattern the monocrystalline layer remaining above the insulative layer, are generally within the skill of the art. As presently contemplated, silicon substrates having surfaces with the <100> or <110> orientations outward are of primary interest for practice of the invention; by comparison, most conventional semiconductors are fabricated from <111> material.

Reactive ion etching processes or KOH etching (or a combination of both) carried out with respect to the <110>material produces lines having a 90° side wall slope with respect to the wafer surface, that is, as shown in FIG. 2; where it is necessary to form taps 64 connected to an elongated conductor 66, as shown in FIG. 8, the masks used should be such that the taps meet the pads at the angle of 109.48°, as shown. Anisotropic KOH etching of <100> material can be used to produce conductors having a 54.75° sidewall slope relative to the wafer surface as shown in FIGS. 3 and 4, and having taps orthogonal to an elongated conductor. The selection between these possibilities, the detailed design of the patterned conductors, and the selection of other relevant processing parameters and the like, are considered to be within the skill of the art.

FIGS. 9–12 illustrate two further test structures according to the invention, in this case specialized for calibration of certain widely-used optical measuring equipment, while FIGS. 13–16 illustrate a further problem encountered in fabrication of such test structures and a solution to this problem.

Optical measuring equipment is commonly used in measuring distances between features, e.g., the width or spacing of conductive "traces" on substrates, components of semiconductor devices in process, apertures in masks used for photolithographic purposes, and the like. Measurements are commonly made by aligning a fiducial mark on a reticle of the instrument with one edge of the feature to be measured, and moving the reticle with respect to the feature by means of a lead screw device or the like until the opposite edge of the feature is similarly aligned. The distance is then a simple function of the amount of rotation of the lead screw. Such device are commonly provided with orthogonal lead screws for two-dimensional measurements.

Calibration of such instruments has typically been carried out employing a reference object having a number of identifiable marks, commonly small crosses, disposed thereon at spacings from one another specified by the manufacturer of the reference object. The reference object is of a size comparable to the operating state of the instrument, and includes a substantial number of such identifiable marks spaced over its surface, so that all sources of inaccuracy are simultaneously compensated for in the calibration process. The instrument is calibrated by aligning the fiducial marks on the reticle of the instrument with the identifiable marks on the reference object, measuring their spacing by normal operation of the instrument, comparing the specified spacings of the identifiable marks with those as measured, and correcting the instrument's readings accordingly.

It will be appreciated that the accuracy of this process is inherently limited by the accuracy of the specification of the spacings of the identifiable marks on the calibration object. At present there is no accepted method of comparing the stated locations of such identifiable marks to a known certified length scale; more specifically, there is available no economically feasible method of certifying the spacings of such marks, particularly in two dimensions, with respect to the United States national length standard, the Line Scale Interferometer (LSI) maintained by the National Institute of Standards and Technology, assignee of this application.

Figure 9:
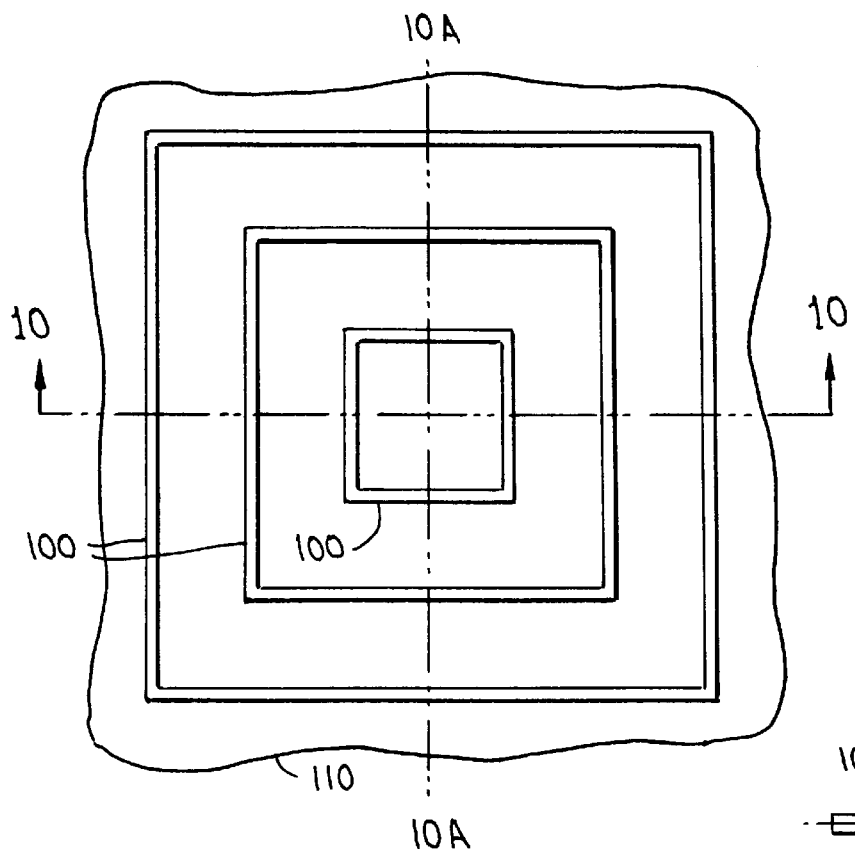
FIG. 9 shows a plan view of a first embodiment of a test structure employing nested quadrilaterals according to a further aspect of the invention.
Figure 10:
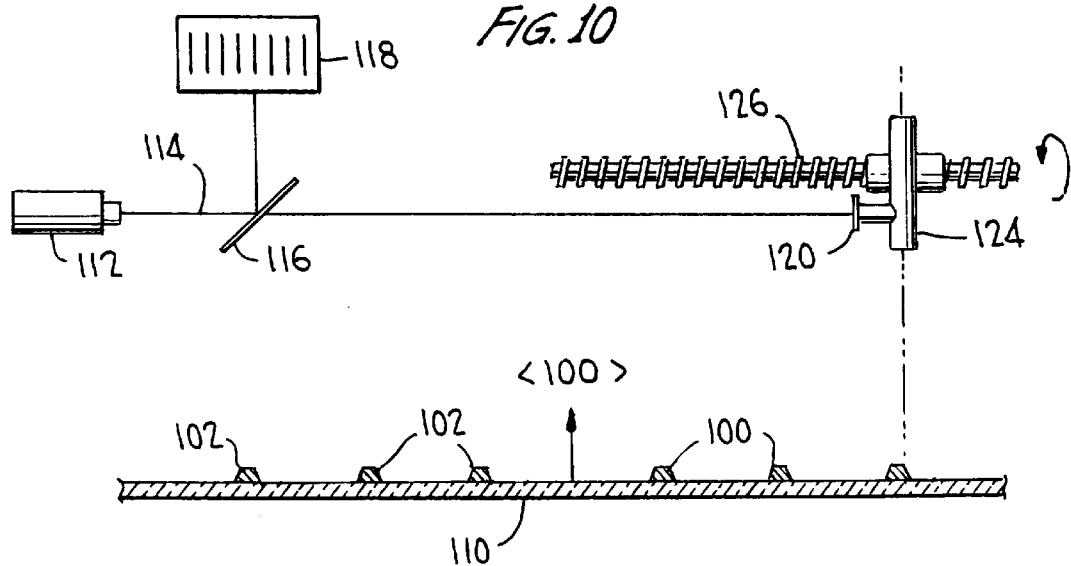
FIG. 10 shows a cross-sectional view taken along line 10—10 of FIG. 9, an illustrates schematically the method of certifying the test structure of FIG. 9.
Figure 11:
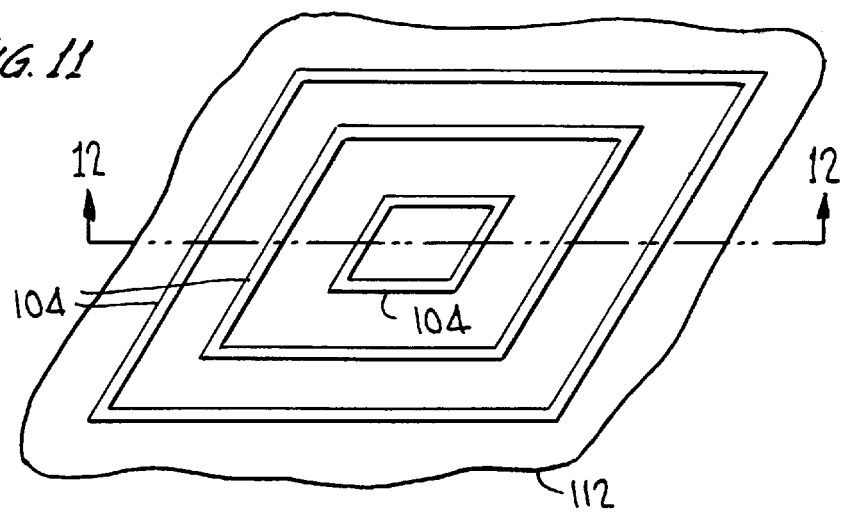
FIG. 11 shows a plan view of a second embodiment of a test structure employing nested quadrilaterals according to this further aspect of the invention.
Figure 12:
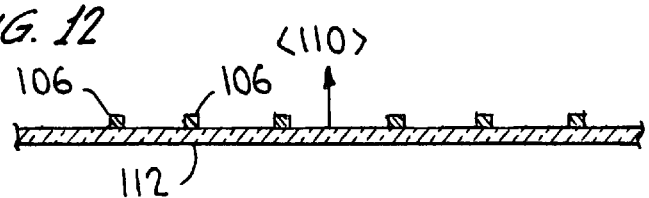
FIG. 12 shows a cross-sectional view taken along line 12—12 of FIG. 11.

FIGS. 9 and 11 show plan views of two embodiments of calibration reference grid structures readily certifiable by the LSI and useful for calibration of such instruments. FIGS. 10 and 12 show cross-sectional views along lines 10—10 and 12—12 respectively, and FIG. 10 additionally illustrates schematically the certification thereof by the LSI.

The calibration reference grid structures shown in FIGS. 9 and 11 each comprise nested quadrilaterals, that is, generally concentric four-sided figures each comprising two pairs of parallel lines. These structures are formed by selective etching of monocrystalline silicon precursors using the techniques discussed above. The quadrilaterals 100 of the FIG. 9 structure are formed of <100> material, so that their pairs of parallel members meet at 90° angles, while, as shown in cross-section by FIG. 10, their sidewalls 102 form angles of 54.75° to the surface of the substrate 110. The quadrilaterals 104 of the FIG. 11 structure are formed of <110> material, and therefore their pairs of parallel members meet at angles of 109.48° and its supplement 70.52°; as shown in cross-section by FIG. 12, their sidewalls 106 form angles of 90° to the surface of the substrate 112.

As discussed above, structures such as the nested quadrilateral calibration reference grids provided according to the present invention can be fabricated by selective etching from monocrystalline precursors so as to have sidewalls each defining a single atomic plane, the sidewalls also being parallel to one another to the same degree. The grids can be etched into the precursor, or may remain after the surrounding portions of the precursor are removed. The spacing of the pairs of lines are measured using the LSI in two directions angled corresponding to the angles at which the lines of the quadrilaterals meet one another. The exact locations of the corners at which the lines meet can then be readily calculated to a like degree of accuracy. The optical instrument may be operated to determine the centerlines of the lines 100, and the point of their intersection 101 forms a precise virtual reference point for calibration purposes. See FIG. 9A.

FIG. 10 shows schematically the use of the LSI to certify the calibration reference grid structure of FIG. 9, by measuring the widths of the lines and the distances between them, along section line 10—10; after rotation of the structure through 90°, the same process would be repeated with respect to the spacings of the other pairs of lines, e.g., along line 10A—10A. This information can then be used to calculate the locations of the "corners", that is, the locations of the intersections of the centerlines of the lines 100 provided to the user for calibrating the optical instrument.

Such calibration reference grid structures comprising nested quadrilateral structures are ideal for calibration of the optical instruments discussed above. The fiducial marks on the reticle of the instrument are aligned with the corners of the quadrilaterals, as they had previously been aligned with the imperfectly-located crosses in the typical prior art reference object. The calibration process then proceeds as previously, using the calculated values of the locations of the corners provided with respect to each of the calibration objects of FIGS. 9 or 11 in lieu of the location of the crosses used previously, for comparison to the spacings of the same objects as measured by the instrument.

Figure 9A:
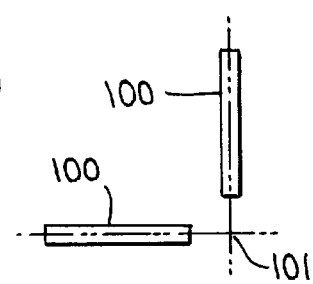
FIG. 9A shows schematically the determination of a virtual grid point at a projected intersection, given the locations of two non-parallel lines.

It will be appreciated that the lines making up the sides of the nested quadrilaterals need not meet one another at the corners, as the fiducial marks can simply be aligned with the lines as indicated by FIG. 9A. It is important that the lines comprising each quadrilateral not cross those of any other quadrilateral, for the reasons discussed above and again below with respect to the Young patent.

As indicated schematically in FIG. 10, the LSI comprises a laser 112 emitting a coherent beam of light 114. The beam is split in a half-silvered mirror 116; one portion is redirected through 90° to a viewing screen 118, and the other passes through mirror 116, towards a second mirror 120, from which it is reflected. The reflected beam is again redirected through 90° by half-silvered mirror 116 so as to be recombined with the other half of the beam on screen 118. The combined beams exhibit interference fringes on screen 118 when the differences in the optical path lengths is an integral number of wavelengths of the light. Mirror 120 is fixed with respect to a microscope 124; both are moved with respect to the object to be measured by a leadscrew device 126 or the like.

In use, microscope 124 is used to locate mirror 120 in fixed A relation to one edge of the object to be measured, here the intersection of a sidewall 102 with the surface of substrate 110. The lead screw device 126 is then operated, moving the assembly of the microscope 124 and mirror 120, until the microscope indicates that it is now aligned with another relevant edge, such as the opposite edge of the same line of the quadrilateral, while the number of times the fringes are observed to reform on screen 118 is counted. The number of fringes counted on the screen during the motion of the mirror multiplied by the wavelength is equal to the distance between the two edges.

The process is continued until a desired number of distances along the line have been measured. The calibration reference grid is then rotated through 90° (or 109.48°, if the FIG. 11 object is to be certified) and the process repeated. The points of intersection between the lines of the quadrilaterals are then calculated and this information supplied along with the calibration reference grid to the user, for calibration of measuring instruments as above.

Use of interferometers to measure distance is a well-developed art, and the simplified description given herein is not intended to be limiting on the invention. Other certifiable methods of measurement of the relevant distances could also be employed in certification of the calibration reference grid structure of the invention.

It is of interest to note that one of the recognized ultimate limitations on the accuracy of interferometric techniques for measurement of length is difficulty in determining the precise location of the edge of the object to be measured. Employment of structures having sidewalls planar to a single atomic diameter is useful in reducing this source of error.

A particular advantage of the two-dimensional reference structures formed according to the invention and illustrated in FIGS. 9 and 11 is that the lines making up the nested quadrilaterals thereof intersect at precisely-known angles.

Figure 13:
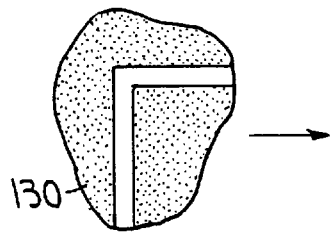
FIG. 13 illustrates schematically a portion of a typical photolithographic mask used to define the locations of corners in structures formed on substrates.
Figure 14:
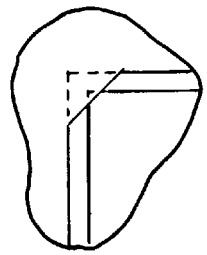
FIG. 14 illustrates typical results using the mask of FIG. 13.
Figure 16:
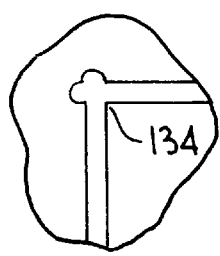
FIG. 16 is a view comparable to FIG. 14, showing improved results obtained using the mask design of FIG. 15.

Applicants have found that if conventional photolithographic and preferential etching techniques are used to form artifacts having square corners, such as the quadrilaterals of FIG. 9, the etchant tends to remove material from the members intended to meet, such that the corner is incomplete. Further details of their investigation are found in Cresswell et al, "Electrical Test Structures Replicated in Silicon-on-Insulator Material", Proc. SPIE Vol. 2725, pp. 659–676 (March 1996). FIGS. 13 and 14 show the effect: if a corner is to be formed using a simple mask 130 of the same outline, as shown in FIG. 13, the tendency is for the members intended to meet to be etched back from their desired intersection, as shown in FIG. 14. This "corner erosion" can be avoided by extending the apertures in the mask past the desired corner, as shown by mask 132 outlined in FIG. 15. A definite inside corner 134 is then formed, as shown in FIG. 16. This is sufficient to allow accurate alignment of a mark on a reticle of an optical measurement instrument with respect to the calibration reference grid, and thereby to permit accurate calibration of the measuring instrument.

As noted, because the nested quadrilaterals of the calibration reference grid of the invention do not intersect one another, the pairs of parallel lines are continuous between their respective intersections, and their sidewalls are atomically accurate along their entire length. Accordingly, measurement of the widths and spacings of the lines at any point along their lengths is sufficient to accurately specify the locations of the corners of the calibration reference grid thus provided. See FIG. 9A, showing accurate location of the center of a "virtual intersection". By comparison, the grid structure shown in, for example, the Young et al patent discussed above is not suitable for calibration of such instruments; as the vertical and horizontal lines defining the apertures of Young's grid are necessarily discontinuous, the sidewalls of their respective segments cannot be relied upon to (and indeed are very unlikely to) lie on the same crystallographic plane. Accordingly, only the locations of the four corners of a single aperture of Young's grid could be determined by two one-dimensional LSI measurements. As noted, because the lines defining applicants' quadrilaterals are continuous, their intersections—whether real or virtual—will be reliably located by measurements made at any point along their lengths.

Using the techniques discussed above, the calibration reference grids of FIGS. 9–12 may be fabricated on transparent and/or insulative substrates. Provision of the calibration reference grid on a transparent substrate will be convenient when an optical instrument operating on a transmissive principle, as illustrated in FIG. 6, is to be calibrated. Reflective instruments can be calibrated using structures formed on non-transparent substrates. Formation of the calibration reference grid on an insulative substrate will be useful in cases where the structure is to be used to cross-correlate LSI, optical, and electrical measurements, for example, measurements of line width. It is also within the scope of the invention to remove a section of the substrate entirely, leaving only (for example) the spaced parallel members of FIGS. 10 or 12.

In the above, the precise structures provided according to the invention were formed of a monocrystalline material, normally silicon. In some circumstances it may be preferred to form similarly precise structures in other materials, including materials not readily amenable to forming macroscopic monocrystalline elements, such as many metals. Such materials can nonetheless be formed to precise dimensions by using a monocrystalline materials as a "die block", forming precise shapes therein using the preferential etching process discussed above, and using this as a "pattern" for "casting" the preferred material.

Figure 17:
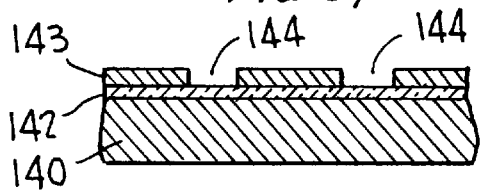
FIGS. 17–19 show cross-sectional views illustrating three stages in fabrication of a further structure according to the invention.
Figure 15:
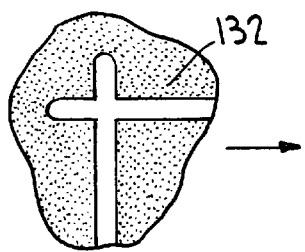
FIG. 15 is a view comparable to FIG. 13, and illustrates an improved mask design.
Figure 18:
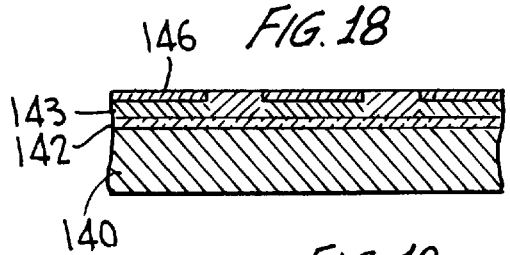
Figure 19:
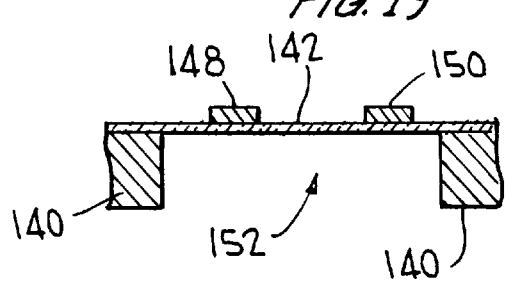

A typical process for doing so is summarized by FIGS. 17–19. FIG. 17 shows a monocrystalline silicon substrate 140, having been processed as above to include a insulative silicon dioxide layer 142 beneath a similarly monocrystalline surface layer 143, formed to include a desired pattern exemplified as two trenches 144. In FIG. 18 the surface has been covered with a layer 146 of the desired material, e.g., a pure metal applied by physical or chemical vapor deposition, also filling trenches 144. Guiffre et al U.S. Pat. No. 5,043,586 shows steps comparable to the etching and filling steps, but does not suggest provision of the insulative layer, nor the steps following. In FIG. 19 the layer 146 has been removed down to the thickness of the monocrystalline layer 143, e.g., by polishing, exposing members 148 in the desired form, followed by removal of the remainder of the monocrystalline layer by etching. A portion of the substrate 152 has also been removed. The result is that atomically-precise members 148, 150 of the desired material remain on the insulative layer 142. It would also be possible to completely remove the insulative layer 142, forming a series of very precise "wires" extending across an open window in space and suspended by the surrounding structure. Such a technique may prove useful for manufacturing extremely precise members of a variety of materials for numerous purposes, possibly including improved characterization of the properties of the material due to the provision of straight members of unprecedentedly precise cross-sectional dimensions.

While several preferred embodiments of the invention have been described, and several distinct methods for its use have been disclosed, it will be appreciated that there are numerous additional modifications and improvements within the scope of the invention. In particular, it should be recognized that the invention may be usefully practiced with monocrystalline materials other than silicon. Further, it will be understood by those of skill in the art that the relative orientation of the various crystalline planes specified herein are but single examples of equivalent relative orientations that might have been specified. Therefore, the invention should not be limited by the above exemplary disclosure, but only by the following claims, and the claims should be interpreted to include all equivalents to the recitations found explicitly therein.

What is claimed is:

1. A method of fabricating atomically precise structures of non-monocrystalline material, comprising the steps of:

providing a monocrystalline substrate;

etching said monocrystalline substrate to define recessed patterns for the formation of desired members of said non-monocrystalline material;

filling said recessed patterns with said non-monocrystalline material; and removing the monocrystalline material around said filled recessed patterns, such that members conforming to said patterns and formed of said non-monocrystalline material remain.

2. The method of claim 1, comprising the further step of forming an insulative layer below the surface of said substrate prior to said step of etching said substrate to define said recessed patterns.

3. The method of claim 2, wherein said insulative layer forms the base of said recessed patterns in said monocrystalline material.

4. The method of claim 2, comprising the further step of removing a portion of said substrate and said insulative layer beneath said members of non-monocrystalline material.

5. The method of claim 1, wherein said patterns etched in said monocrystalline substrate are patterned such that said non-monocrystalline material defines a reference grid.

6. The method of claim 5, wherein said reference grid comprises concentric quadrilaterals having parallel members for calibrating optical instruments employed for positional measurements.

7. The method of claim 6, wherein said monocrystalline substrate is patterned to define a reference grid comprising concentric quadrilaterals by disposition of photolithographic masks on said layer, said masks including intersecting elongated apertures corresponding to the desired locations of said parallel members, and wherein the elongated apertures corresponding to the parallel members of each concentric quadrilateral extend beyond their intersections, to ensure that the intersecting parallel members of the quadrilaterals form complete corners, but do not intersect the apertures corresponding to others of said concentric quadrilaterals.

8. A method of forming a test structure for measurement of features formed thereon, comprising the steps of:

providing a monocrystalline substrate of a material exhibiting preferential etching, such that said material is etched away along certain crystal orientations, but not others, when processed according to a known etching process;

forming an insulative layer within said monocrystalline substrate without disturbing the monocrystalline nature thereof, and exposing a monocrystalline surface;

disposing a mask resistant to said known etching process on said exposed monocrystalline surface, said mask defining a predetermined pattern;

processing said surface having said mask thereon according to said known etching process; and removing said mask;

whereby a monocrystalline patterned conductor exhibiting features selected to permit measurement of geometrical characteristics of conductive members of said monocrystalline material is formed on the exposed surfaces;

wherein said mask disposed over said monocrystalline surface layer is patterned such that said patterned conductor defines an elongated conductor and a plurality of taps intersecting said elongated conductor, in order to enable measurement of the width of said elongated conductor by passing a current therethrough and measuring voltage drops therealong.

9. The method of claim 8, wherein said step of forming an insulative layer within said monocrystalline substrate without disturbing the monocrystalline nature thereof, and exposing a monocrystalline surface, is performed by implantation of oxygen atoms into a monocrystalline silicon substrate, and annealing said substrate, such that an insulative layer of $SiO_2$ is formed in situ.

10. The method of claim 9, comprising the further step of removing a portion of said substrate beneath said pattern formed in said monocrystalline layer, enabling transmissive optical inspection of said pattern through said $SiO_2$ insulative layer.

11. The method of claim 8, wherein said taps intersect said elongated conductor at angles corresponding to the orientation of the respective crystal planes of said monocrystalline material.

12. The method of claim 11, wherein said monocrystalline layer is silicon having an <110> upper surface, said elongated conductor extends in the <112> direction, side walls of said elongated conductor are oriented at 90° with respect to flat upper surfaces of said conductor, and said taps intersect said elongated conductor at angles substantially equal to 109.48°.

13. The method of claim 11, wherein said silicon monocrystalline layer is silicon having an <100> upper surface, said elongated conductor extends in the <110> direction, side walls of said elongated conductor are oriented at substantially 54.75° with respect to flat upper surfaces of said conductor, and said taps intersect said elongated conductor at angles substantially equal to 90°.

14. A method of calibrating measurements of geometrical characteristics of a conductive member formed over an insulating layer on a substrate, comprising the steps of:

providing an insulative layer on a substrate;

providing a monocrystalline layer of a material exhibiting preferential etching, such that said material is etched away along certain crystal orientations, but not others, when exposed to a known etching process, over said insulative layer;

disposing a mask resistant to said known etching process on said exposed surface, said mask defining a predetermined pattern;

exposing said surface having said mask thereon to said known etching process, whereby a patterned conductor is formed on the exposed surface thereof;

making an electrical measurement of a geometrical characteristic of said patterned conductor;

making a measurement of the same geometrical characteristic of said patterned conductor using a non-electrical technique; and comparing said measurements to calibrate the instruments employed to make said measurements.

15. The method of claim 14, wherein said step of making an electrical measurement of a geometrical characteristic of said patterned conductor is performed by:

passing a current along said patterned conductor;

measuring a voltage drop between specified points therealong; and determining the width of said conductor responsive to said measured voltage drop.

16. The method of claim 15, wherein said step of providing an insulative layer on a substrate is performed by implantation of oxygen atoms into a monocrystalline silicon substrate, such that an insulative layer of $SiO_2$ is formed in situ.

17. The method of claim 16, comprising the further step of removing a portion of said substrate beneath said pattern formed in said monocrystalline layer, and wherein said step of making a measurement of a geometrical characteristic of said patterned conductor using a non-electrical technique is performed by transmissive optical inspection of said pattern through said $SiO_2$ insulative layer.

18. The method of claim 14, wherein said step of making a measurement of a geometrical characteristic of said patterned conductor using a non-electrical technique is performed by a techniques selected from the group including scanning probe microscopy, scanning capacitance, or current-forcing techniques.

19. The method of claim 14, comprising the further step of removing a portion from said substrate beneath said pattern formed in said monocrystalline layer, and wherein said step of making an electrical measurement of a geometrical characteristic of said patterned conductor is performed by measuring the capacitance between a portion of the conductor formed of the monocrystalline material and a conductive member on the opposite side of said insulative layer therefrom.

20. The method of claim 14, wherein said monocrystalline layer is patterned to define an elongated conductor and a plurality of taps intersecting said elongated conductor, in order to enable measurement of the width of said elongated conductor by passing a current therethrough and measuring the voltage drop therealong.

21. The method of claim 20, wherein said taps intersect said elongated conductor at angles corresponding to the orientation of the respective crystal planes of said monocrystalline layer.

22. The method of claim 21, wherein said monocrystalline layer is silicon having an <110> upper surface, said elongated conductor extends along the <110> direction, said side walls are oriented at 90° with respect to flat upper surfaces of said conductor, and said taps intersect said elongated conductor at angles substantially equal to 109.48°.

23. The method of claim 21, wherein said monocrystalline layer is silicon having an <100> upper surface, said elongated conductor extends along the <110> direction, said side walls are oriented at substantially 54.75° with respect to flat upper surfaces of said conductor, and said taps intersect said elongated conductor at angles substantially equal to 90°.

24. The method of claim 14, wherein said monocrystalline layer is patterned to define a reference grid.

25. The method of claim 24, wherein said reference grid comprises concentric quadrilaterals having parallel members for calibrating optical instruments employed for positional measurements.

26. The method of claim 25, wherein said monocrystalline layer is patterned to define a reference grid comprising concentric quadrilaterals by disposition of photolithographic masks on said layer, said masks including intersecting elongated apertures corresponding to the desired locations of said parallel members, and wherein the elongated apertures corresponding to the parallel members of each concentric quadrilateral extend beyond their intersections, to ensure that the intersecting parallel members of the quadrilaterals form complete corners, but do not intersect the apertures corresponding to others of said concentric quadrilaterals.

* * * * *